(12) United States Patent
Hishiki et al.

(10) Patent No.: US 10,777,492 B1
(45) Date of Patent: Sep. 15, 2020

(54) SUBSTRATE FOR MOUNTING SEMICONDUCTOR ELEMENT

(71) Applicant: Ohkuchi Materials Co., Ltd., Isa, Kagoshima (JP)

(72) Inventors: Kaoru Hishiki, Isa (JP); Keiichi Otaki, Isa (JP); Hidehiko Sasaki, Isa (JP); Kotaro Tomeoka, Isa (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 16/828,383

(22) Filed: Mar. 24, 2020

(30) Foreign Application Priority Data

Mar. 25, 2019 (JP) .................................. 2019-057172

(51) Int. Cl.
| | |
|---|---|
| *H05K 1/11* | (2006.01) |
| *H01L 23/46* | (2006.01) |
| *H01L 23/495* | (2006.01) |
| *H01L 23/00* | (2006.01) |
| *H05K 1/09* | (2006.01) |
| *H05K 1/18* | (2006.01) |

(52) U.S. Cl.
CPC ........ *H01L 23/49582* (2013.01); *H01L 24/16* (2013.01); *H01L 24/48* (2013.01); *H05K 1/09* (2013.01); *H05K 1/11* (2013.01); *H01L 2224/16245* (2013.01); *H01L 2224/48247* (2013.01); *H05K 1/181* (2013.01)

(58) Field of Classification Search
CPC . H05K 1/09; H05K 1/11; H05K 1/181; H01L 23/49582; H01L 24/16; H01L 24/48
See application file for complete search history.

(56) References Cited

FOREIGN PATENT DOCUMENTS

| | | |
|---|---|---|
| JP | 3626075 B2 | 3/2005 |
| JP | 4508064 B2 | 7/2010 |
| JP | 5151438 B2 | 2/2013 |

*Primary Examiner* — Jeremy C Norris
(74) *Attorney, Agent, or Firm* — Westermann, Hattori, Daniels & Adrian, LLP

(57) ABSTRACT

A substrate for mounting a semiconductor element thereon includes a metal plate and columnar terminal portions composed only of plating layers and formed on one-side surface of the metal plate. The columnar terminal portions include, as an outermost plating layer, a roughened silver plating layer having acicular projections. The roughened silver plating layer has a crystal structure in which the crystal direction <101> occupies a largest proportion among the crystal directions <001>, <111> and <101>. The substrate for mounting a semiconductor element thereon can be manufactured with improved productivity owing to reduction in cost and operation time, and achieves remarkably high adhesion to sealing resin while keeping the total thickness of plating layers including the silver plating layer, which are to serve as terminals and the like, to be thin.

4 Claims, 8 Drawing Sheets

SUBSTRATE FOR MOUNTING SEMICONDUCTOR ELEMENT

CROSS-REFERENCE TO RELATED PATENT APPLICATIONS

This application claims the benefit of Japanese Patent Application No. 2019-057172 filed in Japan on Mar. 25, 2019, the contents of which are incorporated herein by reference.

BACKGROUND OF THE INVENTION

1) Field of the Invention

The present invention relates to a substrate for mounting a semiconductor element thereon including a metal plate and columnar terminal portions composed only of plating layers including a silver plating formed as an outermost plating on one-side surface of the metal plate, wherein the metal plate is to be removed in manufacturing a semiconductor package.

2) Description of Related Art

It is known that: forming a resist mask with a predetermined patterning on a one-side surface of a base material having a conductivity; electrodepositing a conductive metal on the base material where not covered with the resist mask, to form a metal layer for mounting a semiconductor element thereon and an electrode layer to be connected with an external board; removing the resist mask, to form a substrate for mounting a semiconductor element thereon; mounting-and-wire-bonding or flip-chip mounting a semiconductor element on the substrate for mounting a semiconductor element thereon and then performing resin-sealing; and removing the base material produces a semiconductor package in which an other-side surface of the electrodeposited conductive metal is exposed.

Japanese Patent No. 3626075 describes that, by electrodepositing a conductive metal to exceed the thickness of a resist mask, there is obtained a substrate for mounting a semiconductor element thereon having overhang portions at upper rims of a metal layer for mounting a semiconductor element thereon and an electrode layer for connection with the outside, so that, in resin sealing, the overhangs of the metal layer and the electrode layer bite into the resin to securely remain on the resin side.

Japanese Patent No. 4508064 describes that a metal layer or a electrode layer is formed to have an inverted trapezoidal shape by making a resist mask to have a trapezoidal shape upon use of scattered ultraviolet light in forming the resist mask.

Japanese Patent No. 5151438 describes that the contact area between a metal layer and a sealing resin is increased by a roughened surface given to the outer face of the metal layer, thereby enhancing adhesion between the metal layer and the resin sealing to make overhang portions of the metal layer securely remain on the resin side.

After repeated trial and error, the present inventors have found it possible to keep the total thickness of the plating layer to be thin as well as to remarkably increase adhesion to the sealing resin.

SUMMARY OF THE INVENTION

A substrate for mounting a semiconductor element thereon of embodiment modes of the present invention includes a metal plate and columnar terminal portions composed only of plating layers and formed on one-side surface of the metal plate, wherein the columnar terminal portions include, as an outermost plating layer, a roughened silver plating layer having acicular projections, and the roughened silver plating layer has a crystal structure in which the crystal direction <101> occupies a largest proportion among the crystal directions <001>, <111> and <101>.

According to the embodiment modes of the present invention, a substrate for mounting a semiconductor element thereon provided with columnar terminal portions composed only of plating layers including a silver plating formed as an outermost plating on one-side surface of a metal plate can be manufactured with improved productivity owing to reduction in cost and operation time, achieves remarkably high adhesion to sealing resin while keeping the total thickness of the plating layers including the silver plating layer to be thin.

These and other features of the present invention will become apparent from the following detailed description of the preferred embodiments when taken in conjunction with the accompanying drawings.

BRIEF DESCRIPTION OF THE DRAWINGS

FIG. 1A is a top view and FIG. 1B is an explanatory diagram schematically showing the A-A cross section in FIG. 1A.

FIG. 5A is a top view and FIG. 5B is an explanatory diagram schematically showing the B-B cross section in FIG. 5A.

DETAILED DESCRIPTION OF THE EMBODIMENTS

Figure 1A:
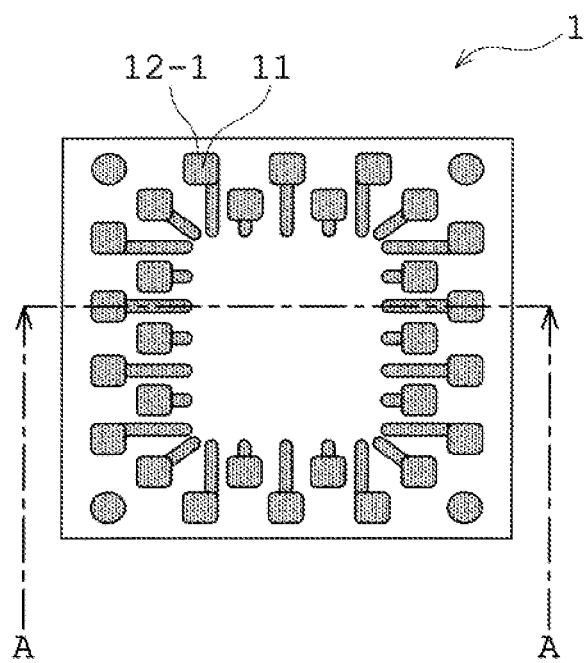
FIGS. 1A-1B are diagrams that show one example of substrate for mounting a semiconductor element thereon according to a first embodiment mode of the present invention, where

Preceding the description of the embodiment modes, the background leading to the derivation of the present invention and the operation and effect of the present invention will be described.

The present inventors considered, as a measure to improve adhesion between columnar terminal portions composed only of plating layers, which are used as terminals in a semiconductor package or the like, and resin, the configuration in which an undercoat plating layer for top faces of the columnar terminal portion is formed to have roughened outer surface and thereon a noble metal plating layer is laminated as following the shape of the roughened surface. However, in order to form the roughened outer surface of the undercoat plating layer to have such irregularities as to maintain high adhesion to the resin even if the noble metal plating layer is laminated thereon, the undercoat plating layer has to be formed thick. Moreover, since the plating speed for forming the undercoat plating layer with a roughened surface is slow, the working time increases to raise the cost and lower the productivity.

Also, the present inventors considered, as another measure for improving adhesion to the resin, the configuration in which a noble metal plating layer is processed, after being formed on the top faces of the columnar terminal portions as having a smooth outer surface, to have its outer surface roughened. However, in order to form the outer surface of the noble metal plating layer to be a roughened surface having such irregularities as to improve adhesion to the resin, the smooth noble metal plating layer before roughening treatment should be formed thick, and thus the cost of noble metal plating layer increases and the productivity is lowered.

Next, the present inventors considered that, in order to improve adhesion to the sealing resin and to reduce the total thickness of plating layers while reducing the cost and working time for forming a roughened outer surface for improved productivity, it was necessary, regarding the configuration of columnar terminal portions provided on a metal plate, to laminate an undercoat plating layer to be smooth and thereon to form a silver plating layer with a roughened outer surface not by roughening the outer surface of a smooth silver plating layer.

Then, in the process of trial and error, the present inventors have derived a substrate for mounting a semiconductor element thereon in which, regarding the configuration of columnar terminal portions composed only of plating layers and provided on a metal plate, a roughened silver plating layer with acicular projections formed not by roughening the outer surface of a smooth silver plating layer is formed as the outermost plating layer on the upper surface of the undercoat plating layer.

In the present application, the acicular projections included in the roughened silver plating layer are defined as an aggregate of a plurality of acicular projections having a surface area ratio (here, the ratio of the surface area of the roughened silver plating layer to the surface area of the corresponding smooth surface) of 1.30 or more and 6.00 or less.

It has been found that a roughened silver plating layer having acicular projections with such a surface area ratio would make sealing resin easily flow into the roots of the individual acicular projections, so that, when the sealing resin is cured, the large contact area and the intricate contour can enhance the physical anchor effect to achieve good adhesion.

Further, as a result of repeated trial and error by the present inventors, it has been found that a roughened silver plating layer having acicular projections could be formed by growing a crystal structure in which the proportion of a predetermined crystal direction is high as being different from a crystal structure of a conventional smooth silver plating layer or a roughened silver plating layer formed by roughening the outer surface of a smooth silver plating layer, and that the roughened surface having the acicular projections formed of well-grown such a crystal structure would be effective in remarkably improving adhesion to sealing resin compared with a roughened surface formed by the conventional technique. In this way, the present invention has been derived.

A substrate for mounting a semiconductor element thereon of embodiment modes of the present invention includes a metal plate and columnar terminal portions composed only of plating layers and formed on one-side surface of the metal plate, wherein the columnar terminal portions include, as an outermost plating layer, a roughened silver plating layer having acicular projections, and the roughened silver plating layer has a crystal structure in which the crystal direction <101> occupies a largest proportion among the crystal directions <001>, <111> and <101>.

As in the substrate for mounting a semiconductor element thereon of the embodiment modes of the present invention, if a roughened silver plating layer has acicular projections having a surface area ratio of 1.30 or more and 6.00 or less (i.e. the ratio of the surface area of the roughened silver plating layer to the surface area of the corresponding smooth surface), sealing resin would easily flow into the roots of the individual acicular projections. Therefore, when the sealing resin is cured, the large contact area and the intricate contour can enhance the physical anchor effect, to achieve good adhesion. The directions in which the individual acicular projections extend are not uniform; not only the upward direction and oblique directions but also the shape of bent needles are included. If the individual acicular projections are randomly extended radially, the anchor effect on the sealing resin can be further enhanced.

Further, as in the substrate for mounting a semiconductor element thereon of the embodiment modes of the present invention, if a roughened silver plating layer with acicular projections provided as the outermost plating layer on the upper surface of the undercoat plating layer in columnar terminal portions is configured to have a crystal structure in which the crystal direction <101> occupies a largest proportion among the crystal directions <001>, <111> and <101>, such a roughened silver plating layer allows sealing resin to easily flow into its deeper portions and accordingly exerts higher adhesion to the sealing resin than other roughened silver plating layers such as those having roughened surfaces with a surface area ratio (i.e. the ratio of the surface area of the silver plating layer to the surface area of the corresponding smooth surface) of less than 1.30 and those formed by roughening the outer surface of a smooth silver plating layer having the conventional crystal structure, which is different from the crystal structure in which the crystal direction <101> occupies a largest proportion among the crystal directions <001>, <111> and <101>.

Also, if the configuration is made as in the substrate for mounting a semiconductor element thereon according to the embodiment modes of the present invention, at the semiconductor element mounting portion, on which a semiconductor element is to be mounted, and at internal connection terminal portions, which are to be electrically connected with the semiconductor element directly or via wires, on the upper surface side of the columnar terminal portions, the contact area with the connection member such as solder or paste is increased by the acicular projections of the roughened silver plating layer, whereby seepage of moisture can be prevented, the strain caused by thermal expansion is prevented, and delamination between the connection member and the plating film is prevented.

Also, if the configuration is made as in the substrate for mounting a semiconductor element thereon according to the embodiment modes of the present invention, since adhesion to the sealing resin can be remarkably improved by the crystal structure of the roughened silver plating layer having acicular projections, a thin and smooth undercoat plating layer formed at the columnar terminal portions serves the purpose; it is not necessary to form a undercoat plating layer with a roughened surface.

The roughened silver plating layer having acicular projections with a crystal structure in which the crystal direction <101> occupies a largest proportion among the crystal directions <001>, <111> and <101> can be formed by silver plating under the conditions described later, without roughening the surface of a smooth silver plating layer.

Therefore, by employing the substrate for mounting a semiconductor element thereon of the embodiment modes of the present invention, it is possible to minimize the processing cost of the roughened surface for improved adhesion with resin, and to minimize the total thickness of the plating layers.

Further, in the substrate for mounting a semiconductor element thereon of the embodiment modes of the present invention, preferably, the average diameter of crystal grains in the roughened silver plating layer is smaller than 0.28 µm.

If the average diameter of crystal grains in the roughened silver plating layer is 0.28 µm or greater, after crystals for silver plating grow in the height direction, spaces between the crystals come to be wide and thus the surface area ratio (i.e. the ratio of the surface area of the roughened silver plating layer to the surface area of the corresponding smooth surface) fails to be within the range of 1.30 to 6.00.

If the average diameter of crystal grains in the roughened silver plating layer is smaller than 0.28 µm, after crystals for silver plating grow in the height direction, spaces between the crystals come to be narrow and thus the surface area ratio (i.e. the ratio of the surface area of the roughened silver plating layer to the surface area of the corresponding smooth surface) can be within the range of 1.30 to 6.00. More preferably, the roughened silver plating layer has crystal grains with an average diameter of 0.15 µm or more and 0.25 µm or less.

Also, in the substrate for mounting a semiconductor element thereon of the embodiment modes of the present invention, the configuration is preferably made so that a plating layer that is in contact with the metal plate in the columnar terminal portions is a gold plating layer.

Also, in the substrate for mounting a semiconductor element thereon of the present invention, the columnar terminal portions preferably are configured to be composed of plating layers of metals laminated in order of appearance in any of the following (1) to (6) from the metal plate side:

(1) gold/nickel/silver
(2) gold/palladium/nickel/silver
(3) gold/palladium/nickel/palladium/silver
(4) gold/nickel/palladium/silver
(5) gold/nickel/palladium/gold/silver
(6) gold/palladium/nickel/palladium/gold/silver.

In the case where the columnar terminal portions are composed of plating layers made of metals laminated in the order of gold/nickel/silver, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a roughened silver plating layer with acicular projections with a thickness of 0.2 µm or more and 3.0 µm or less, much preferably 0.5 µm.

In the case where the columnar terminal portions are composed of plating layers made of metals laminated in the order of gold/palladium/nickel/silver, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a palladium plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a roughened silver plating layer with acicular projections with a thickness of 0.2 µm or more and 3.0 µm or less, much preferably 0.5 µm.

In the case where the columnar terminal portions are composed of plating layers made of metals laminated in the order of gold/palladium/nickel/palladium/silver, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a palladium plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a palladium plating layer with a thickness of 0.005 µm or more and 1.5 µm or less, much preferably 0.05 µm, on which formed is a roughened silver plating layer with acicular projections with a thickness of 0.2 µm or more and 3.0 µm or less, much preferably 0.5 µm.

In the case where the columnar terminal portions are composed of plating layers made of metals laminated in the order of gold/nickel/palladium/silver, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a palladium plating layer with a thickness of 0.005 µm or more and 1.5 µm or less, much preferably 0.05 µm, on which formed is a roughened silver plating layer with acicular projections with a thickness of 0.2 µm or more and 3.0 µm or less, much preferably 0.5 µm.

In the case where the columnar terminal portions are composed of plating layers made of metals laminated in the order of gold/nickel/palladium/gold/silver, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a palladium plating layer with a thickness of 0.005 µm or more and 1.5 µm or less, much preferably 0.05 µm, on which formed is a gold plating layer with a thickness of 0.0005 µm or more and 0.5 µm or less, much preferably 0.005 µm, on which formed is a roughened silver plating layer with acicular projections with a thickness of 0.2 µm or more and 3.0 µm or less, much preferably 0.5 µm.

In the case where the columnar terminal portions are composed of plating layers made of metals laminated in the order of gold/palladium/nickel/palladium/gold/silver, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a palladium plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a palladium plating layer with a thickness of 0.005 µm or more and 1.5 µm or less, much preferably 0.05 µm, on which formed is a gold plating layer with a thickness of 0.0005 µm or more and 0.5 µm or less, much preferably 0.005 µm, on which formed is a roughened silver plating layer with acicular projections with a thickness of 0.2 µm or more and 3.0 µm or less, much preferably 0.5 µm.

Also, in the substrate for mounting a semiconductor element thereon of the embodiment modes of the present invention, the material of the metal plate as a base of the substrate for mounting a semiconductor element thereon can be a stainless steel-based alloy other than copper-based materials such as a copper alloy.

In the case where the material of the metal plate as a base of the substrate for mounting a semiconductor element thereon in the substrate for mounting a semiconductor element thereon of the embodiment modes of the present invention is a stainless steel-based alloy, the columnar terminal portions are composed of plating layers made of metals laminated in the order of gold/nickel/palladium/silver. In this case, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a smooth-crystal nickel plating layer with a thickness of 20.0 µm or more and 80.0 µm or less, much preferably 30.0 µm, on which formed is a palladium plating layer with a thickness of 0.005 µm or more and 1.5 µm or less, much preferably 0.05 µm, on which formed is a roughened silver plating layer with acicular projections with a thickness of 0.2 µm or more and 3.0 µm or less, much preferably 0.5 µm.

It is preferable that the surface area ratio (i.e. the ratio of the surface area of the roughened silver plating layer to the surface area of the corresponding smooth surface) of the roughened silver plating layer having acicular projections with a crystal structure in which the crystal direction <101> occupies a largest proportion among the crystal directions <001>, <111> and <101> in the columnar terminal portions composed of plating layers made of metals laminated in the order indicated in each of the examples above is 1.30 or more and 6.00 or less, much preferably 3.00.

The roughened silver plating layer having acicular projections with a crystal structure in which the crystal direction <101> occupies a largest proportion among the crystal directions <001>, <111> and <101> in the substrate for mounting a semiconductor element thereon according to the embodiment modes of the present invention can be obtained by plating upon use of a silver plating bath having a silver concentration of 1.0 g/L or more and 10 g/L or less, which is a methanesulfonic acid-based silver plating solution, for 5 to 60 seconds at a temperature of 55° C. to 65° C. and a current density of 3 A/dm$^2$ to 20 A/dm$^2$.

Therefore, according to the embodiment modes of the present invention, it is possible to manufacture a substrate for mounting a semiconductor element thereon including, on one-side surface of a metal plate, columnar terminal portions composed only of plating layers including a silver plating applied as an outermost plating upon staying the total thickness of the plating layers including the silver plating layer to be small and remarkably increasing adhesion to the sealing resin while reducing cost and working time for forming the outermost, roughened surface, to improve productivity.

Hereinafter, substrates for mounting semiconductor elements thereon to which the embodiment modes of the present invention are applied and a manufacturing method therefor will be described. The present invention is not limited to the following detailed description unless otherwise specifically limited.

First Embodiment Mode

Figure 1B:
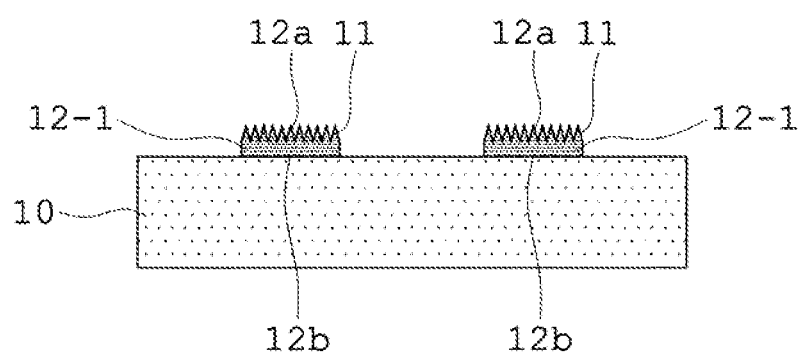
Figure 2:
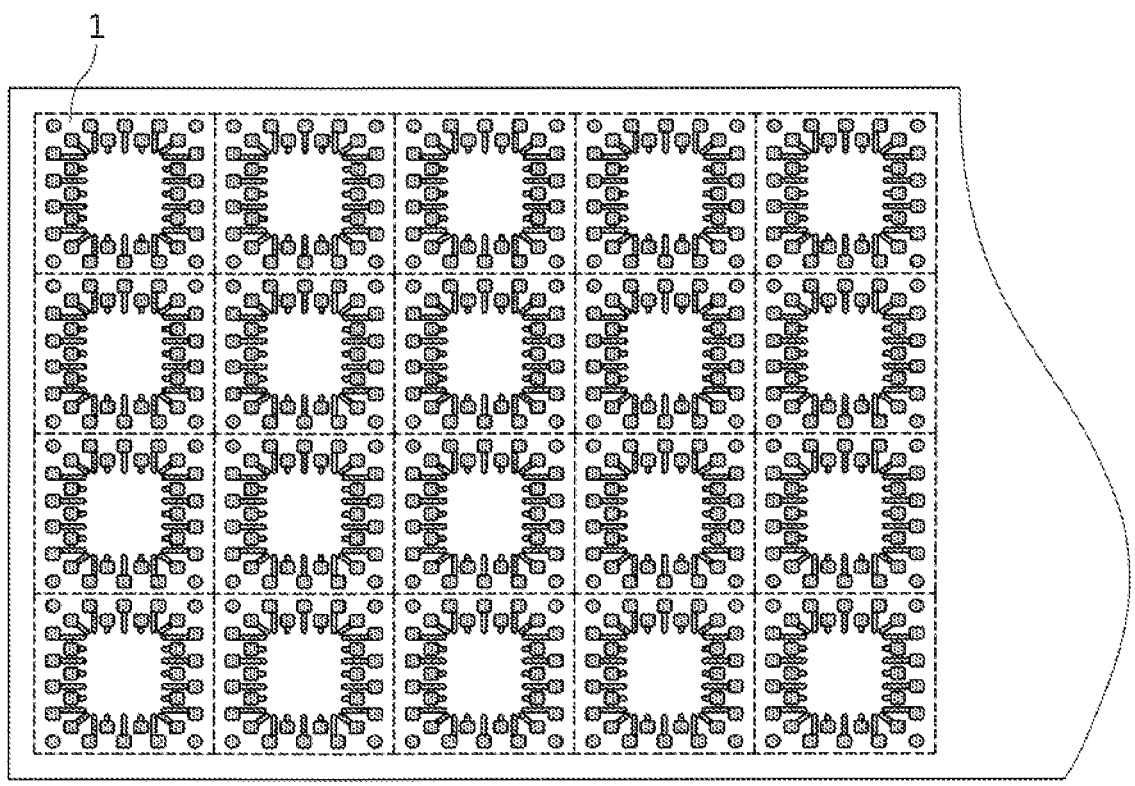
FIG. 2 is a plan view that shows one example of substrates for mounting semiconductor elements thereon arrayed in multiple rows according to the first embodiment mode of the present invention.

FIGS. 1A-1B are diagrams that show one example of substrate for mounting a semiconductor element thereon according to a first embodiment mode of the present invention, where FIG. 1A is a top view and FIG. 1B is an explanatory diagram schematically showing the A-A cross section in FIG. 1A. FIG. 2 is a plan view that shows one example of substrates for mounting semiconductor elements thereon arrayed in multiple rows according to the first embodiment mode of the present invention. FIGS. 3A-3E are explanatory diagrams that show one example of manufacturing procedure for the substrate for mounting a semiconductor element thereon according to the first embodiment mode of the present invention. FIGS. 4A-4F are explanatory diagrams that show one example of manufacturing procedure for a semiconductor package using the substrate for mounting a semiconductor element thereon according to the first embodiment mode of the present invention.

As shown in FIG. 1A, a substrate 1 for mounting a semiconductor element thereon of this embodiment mode is provided with, on one-side surface of a metal plate 10 made of a copper-based material, a plurality of columnar terminal portions 12-1 extending from four sides toward a site on which a semiconductor element is to be mounted.

The columnar terminal portions 12-1 are composed only of plating layers of different metals and, as shown in FIG. 1B, are provided with a roughened silver plating layer 11 having acicular projections as an outermost plating layer.

The roughed silver plating layer 11 has acicular projections with a surface area ratio (i.e. the ratio of the surface area of the roughened silver plating layer to the surface area of the corresponding smooth surface) of 1.30 or more and 6.00 or less.

The roughened silver plating layer 11 has a crystal structure in which the crystal direction <101> occupies a largest proportion among the crystal directions <001>, <111> and <101>.

The average diameter of crystal grains in the roughened silver plating layer 11 is smaller than 0.28 Mm.

As shown in FIG. 1B, the columnar terminal portions 12-1 are configured so that, in a complete semiconductor package, one-side surface thereof serves as internal connection terminal portions 12a to be connected with a semiconductor element as well as other-side surface thereof serves as external connection terminal portions 12b to be connected with an external board.

The columnar terminal portions 12-1 are configured so that a plating layer thereof that is in contact with the metal plate 10 is a gold plating layer.

For the columnar terminal portions 12-1, undercoat plating layers beneath the roughened silver plating layer 11 can be formed by plating with metals selected among gold, palladium, nickel and the like and alloys thereof, to laminate them orderly.

The columnar terminal portions 12-1 can be composed of plating layers made of metals laminated in the order of gold/nickel/silver. In this case, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a roughened silver plating layer with acicular projections with a thickness of 0.2 μm or more and 3.0 μm or less, much preferably 0.5 μm.

Also, the columnar terminal portions 12-1 can be composed of plating layers made of metals laminated in the order of gold/palladium/nickel/silver. In this case, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a roughened silver plating layer with acicular projections with a thickness of 0.2 μm or more and 3.0 μm or less, much preferably 0.5 μm.

Also, the columnar terminal portions can be composed of plating layers made of metals laminated in the order of gold/palladium/nickel/palladium/silver. In this case, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a roughened silver plating layer with acicular projections with a thickness of 0.2 μm or more and 3.0 μm or less, much preferably 0.5 μm.

Also, the columnar terminal portions 12-1 can be composed of plating layers made of metals laminated in the order of gold/nickel/palladium/silver. In this case, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a roughened silver plating layer with acicular projections with a thickness of 0.2 pun or more and 3.0 μm or less, much preferably 0.5 μm.

Also, the columnar terminal portions 12-1 can be composed of plating layers made of metals laminated in the order of gold/nickel/palladium/gold/silver. In this case, it is preferable that, on one-side surface of the metal plate 10 at sites corresponding to the columnar terminal portions 12-1, there is formed a gold plating layer with a thickness of 0.005 pun or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a gold plating layer with a thickness of 0.0005 μm or more and 0.5 μm or less, much preferably 0.005 μm, on which formed is a roughened silver plating layer with acicular projections with a thickness of 0.2 μm or more and 3.0 μm or less, much preferably 0.5 μm.

Also, the columnar terminal portions 12-1 can be composed of plating layers made of metals laminated in the order of gold/palladium/nickel/palladium/gold/silver, it is preferable that, on one-side surface of the metal plate at sites corresponding to the columnar terminal portions, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a gold plating layer with a thickness of 0.0005 μm or more and 0.5 μm or less, much preferably 0.005 μm, on which formed is a roughened silver plating layer with acicular projections with a thickness of 0.2 μm or more and 3.0 μm or less, much preferably 0.5 μm.

Also, the material of the metal plate 10 as a base of the substrate 1 for mounting a semiconductor element thereon can be a stainless steel-based alloy other than copper-based materials such as a copper alloy.

In the case where the material of the metal plate 10 is a stainless steel-based alloy, the columnar terminal portions 12-1 are composed of plating layers made of metals laminated in the order of gold/nickel/palladium/silver. In this case, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a smooth-crystal nickel plating layer with a thickness of 20.0 μm or more and 80.0 μm or less, much preferably 30.0 μm, on which formed is a palladium plating layer with a thickness of 0.005 μm or more and 1.5 μm or less, much preferably 0.05 pun, on which formed is a roughened silver plating layer with acicular projections with a thickness of 0.2 μm or more and 3.0 μm or less, much preferably 0.5 μm.

It is preferable that the surface area ratio (i.e. the ratio of the surface area of the roughened silver plating layer to the surface area of the corresponding smooth surface) of the roughened silver plating layer 11 having acicular projections with a crystal structure in which the crystal direction <101> occupies a largest proportion among the crystal directions <001>, <111> and <101> in the columnar terminal portions 12-1 composed of plating layers made of metals laminated in the order indicated in each of the examples above is 1.30 or more and 6.00 or less, much preferably 3.00.

The substrate 1 for mounting a semiconductor element thereon of this embodiment mode is configured so that, as shown in FIG. 2, the individual substrates 1 for mounting semiconductor elements thereon are arrayed in multiple rows.

Next, an example of manufacturing procedure for the substrate 1 for mounting a semiconductor element thereon of this embodiment mode will be described in reference to FIGS. 3A-3E.

Figure 3A:
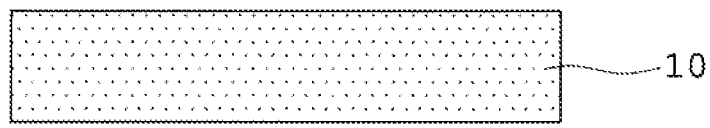
FIGS. 3A-3E are explanatory diagrams that show one example of manufacturing procedure for the substrate for mounting a semiconductor element thereon according to the first embodiment mode of the present invention.

First, a metal plate 10 made of a copper-based material is prepared as a base material of the substrate for mounting a semiconductor element (See FIG. 3A).

Figure 3B:
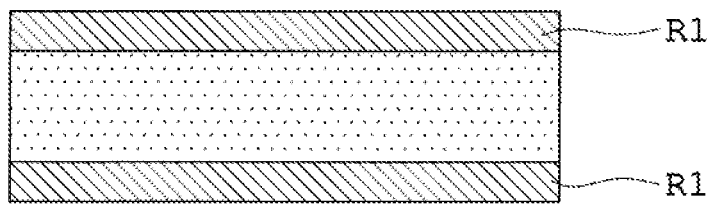

Then, resist layers R1 are formed on both surfaces of the metal plate 10 (See FIG. 3B).

Figure 3C:
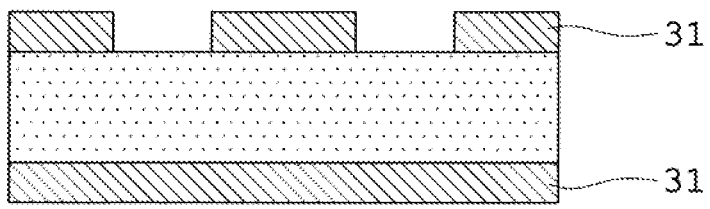

Then, the resist layer R1 on the upper surface side of the metal plate 10 is exposed and developed upon use of a glass mask carrying a predetermined pattern corresponding to columnar terminal portions 12-1 as well as the entire region of the resist layer R1 on the lower surface side of the metal plate 10 is exposed and developed, to form plating resist masks 31 having openings at sites corresponding to the columnar terminal portions 12-1 on the upper surface side of the metal plate 10 and covering the entire region on the lower surface side of the metal plate 10 (See FIG. 3C).

Figure 3D:
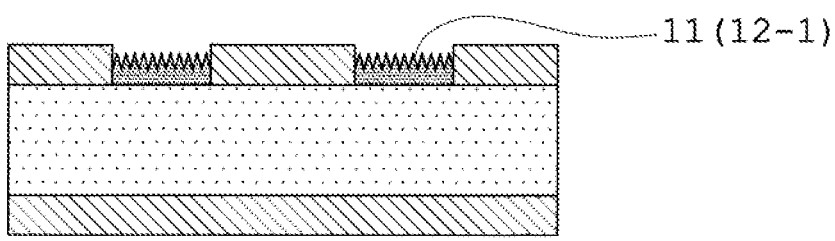

Then, upon use of the plating resist masks 31, a roughened silver plating layer 11 having acicular projections is formed as an outermost plating layer on the upper surface of the metal plate 10 at the sites corresponding to the columnar terminal portions 12-1 (See FIG. 3D).

Figure 3E:
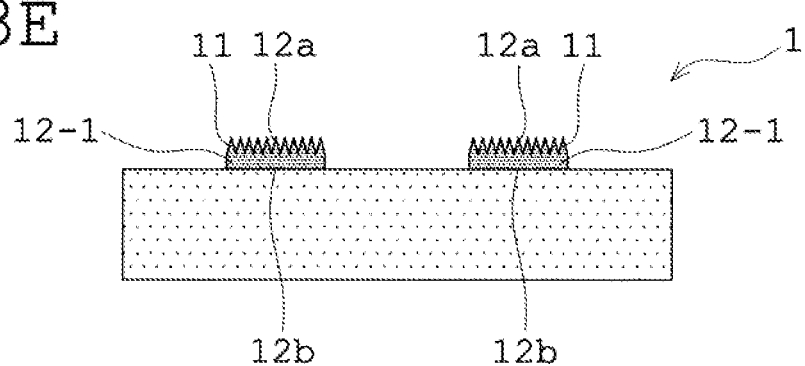

Then, the plating resist masks 31 are removed (See FIG. 3E).

Thereby, the substrate 1 for mounting a semiconductor element thereon of this embodiment mode is completed.

Regarding the process of forming the columnar terminal portions 12-1 in which the silver plating layer 11 having acicular projections is the outermost plating layer, in the case where the columnar terminal portions 12-1 are composed of plating layers made of metals laminated in the order of gold/nickel/silver, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is the roughened silver plating layer 11 with acicular projections with a thickness of 0.2 μm or more and 3.0 μm or less, much preferably 0.5 μm.

In the case where the columnar terminal portions 12-1 are composed of plating layers made of metals laminated in the order of gold/palladium/nickel/silver, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 amu, on which formed is a smooth-crystal nickel plating layer with a thickness of 5.0 μm or more and 80.0 μm or less, much preferably 30.0 μm, on which formed is the roughened silver plating layer 11 with acicular projections with a thickness of 0.2 μm or more and 3.0 μm or less, much preferably 0.5 μm.

In the case where the columnar terminal portions 12-1 are composed of plating layers made of metals laminated in the order of gold/palladium/nickel/palladium/silver, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is the roughened silver plating layer 11 with acicular projections with a thickness of 0.2 μm or more and 3.0 μm or less, much preferably 0.5 μm.

In the case where the columnar terminal portions 12-1 are composed of plating layers made of metals laminated in the order of gold/nickel/palladium/silver, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is the roughened silver plating layer 11 with acicular projections with a thickness of 0.2 μm or more and 3.0 μm or less, much preferably 0.5 μm.

In the case where the columnar terminal portions 12-1 are composed of plating layers made of metals laminated in the order of gold/nickel/palladium/gold/silver, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a gold plating layer with a thickness of 0.0005 μm or more and 0.5 μm or less, much preferably 0.005 μm, on which formed is the roughened silver plating layer 11 with acicular projections with a thickness of 0.2 μm or more and 3.0 μm or less, much preferably 0.5 μm.

In the case where the columnar terminal portions 12-1 are composed of plating layers made of metals laminated in the order of gold/palladium/nickel/palladium/gold/silver, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a gold plating layer with a thickness of 0.0005 μm or more and 0.5 μm or less, much preferably 0.005 μm, on which formed is the roughened silver plating layer 11 with acicular projections with a thickness of 0.2 μm or more and 3.0 μm or less, much preferably 0.5 μm.

The material of the metal plate 10 serving as a base of the substrate 1 for mounting a semiconductor element thereon may be a stainless steel-based alloy. In this case, the columnar terminal portions 12-1 are composed of plating layers made of metals laminated in the order of gold/nickel/palladium/silver. In this case, it is preferable that, on one-side surface of the metal plate 10 at sites corresponding to the columnar terminal portions 12-1, there is formed a gold plating layer with a thickness of 0.005 μm or more and 0.5 μm or less, much preferably 0.05 μm, on which formed is a smooth-crystal nickel plating layer with a thickness of 20.0 μm or more and 80.0 μm or less, much preferably 30.0 μm, on which formed is a palladium plating layer with a thickness of 0.005 μm or more and 1.5 μm or less, much preferably 0.05 μm, on which formed is the roughened silver plating layer with acicular projections with a thickness of 0.2 μm or more and 3.0 μm or less, much preferably 0.5 μm.

In order to form the roughened silver plating layer 11 having acicular projections with a surface area ratio (i.e. the ratio of the surface area of the roughened silver plating layer to the surface area of a corresponding smooth surface) of 1.30 or more and 6.00 or less and with a crystal structure in which the crystal direction <101> occupies a largest proportion among the crystal directions <001>, <111> and <101>, the silver concentration in a silver plating bath composed of a methanesulfonic acid-based silver plating solution is set in the range of 1.0 g/L or more and 10 g/L or less. In particular, it is much preferable that the silver concentration is in the range of 1.5 g/L or more and 5.0 g/L or less.

A silver concentration lower than 1.0 g/L is not preferable because a roughened silver plating film cannot be formed sufficiently. A silver concentration higher than 10 g/L causes the film of the roughened silver plating layer to have a smooth surface, or fails to form acicular silver crystals, and thus is not preferable.

Next, an example of manufacturing procedure for a semiconductor package using the substrate 1 for mounting a semiconductor element thereon of this embodiment mode will be described in reference to FIGS. 4A-4F.

Figure 4A:
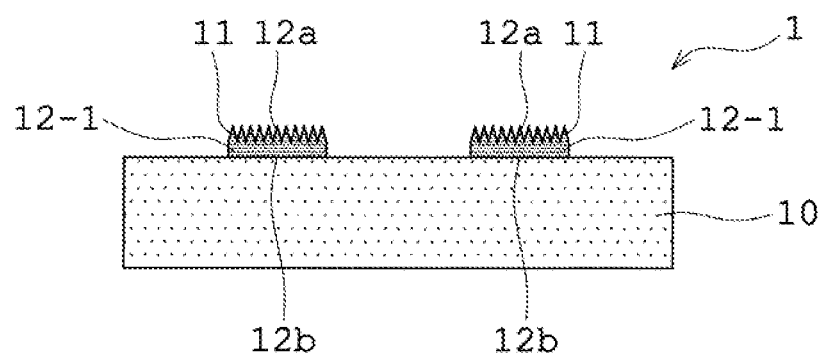
FIGS. 4A-4F are explanatory diagrams that show one example of manufacturing procedure for a semiconductor package using the substrate for mounting a semiconductor element thereon according to the first embodiment mode of the present invention.

First, the substrate 1 for mounting a semiconductor element thereon manufactured in accordance with the manufacturing procedure shown in FIGS. 3A-3E is prepared (See FIG. 4A).

Figure 4B:
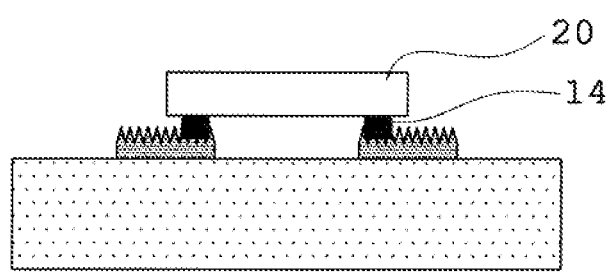

Then, solder 14 is printed on a site on which a semiconductor element is to be mounted, which is in the internal connection terminal portions 12a on top faces of the columnar terminal portions 12-1 of the substrate for mounting a semiconductor element thereon, and a semiconductor element 20 is mounted thereon and fixed, so that electrodes of the semiconductor element 20 and the internal connection terminal portions 12a of the substrate 1 for mounting a semiconductor element thereon are electrically connected (See FIG. 4B).

Figure 4C:
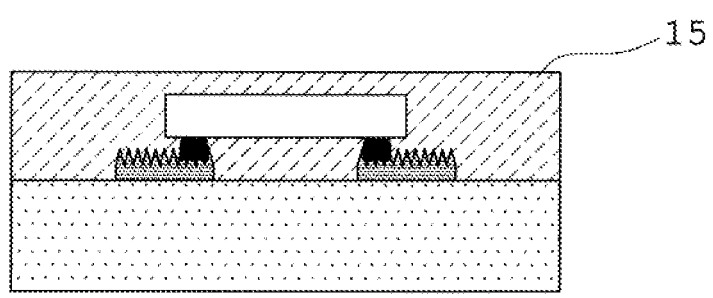

Then, a mold is used to seal, with sealing resin 15, a surrounding space region on the upper surface side of the substrate 1 for mounting a semiconductor element thereon (See FIG. 4C).

Figure 4D:
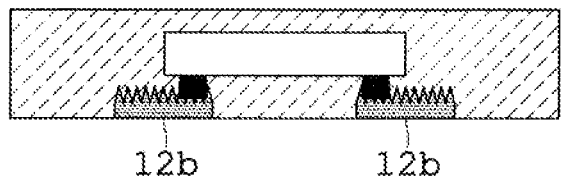

Then, the metal plate 10 serving as a base of the substrate 1 for mounting a semiconductor element thereon is removed by etching in the case of the metal plate 10 being made of a copper-based material or by peeling in the case of the metal plate 10 being made of a stainless steel-based material (See FIG. 4D).

Figure 4E:
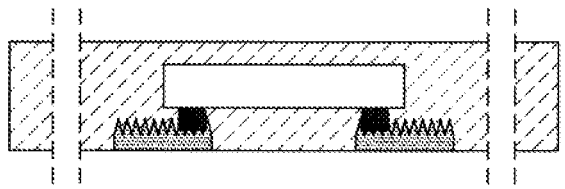

Lastly, semiconductor packages arrayed in multiple rows are singulated by dicing, pressing or the like (See FIG. 4E).

Figure 4F:
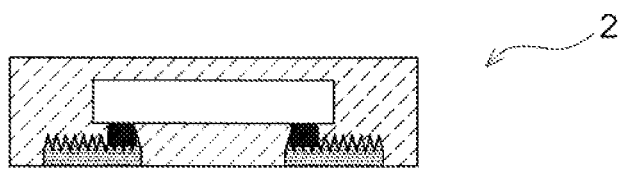

Thereby, a semiconductor package 2 using the substrate 1 for mounting a semiconductor element thereon of this embodiment mode is obtained (See FIG. 4F).

Figure 5A:
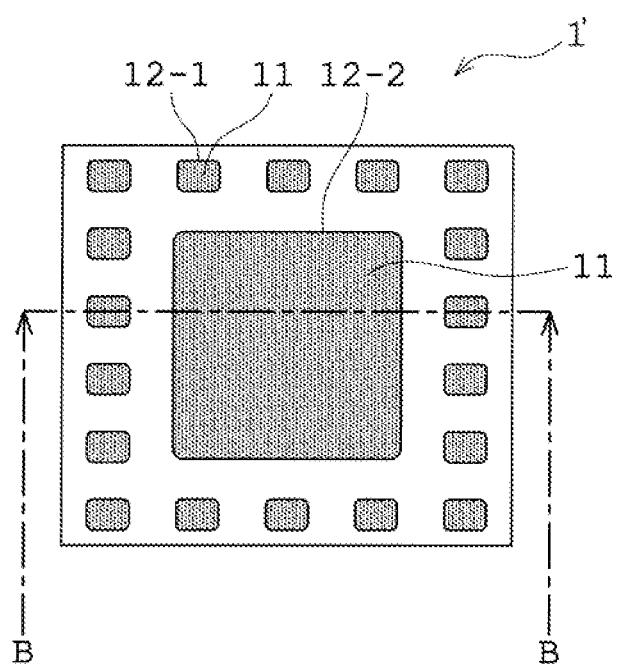
FIGS. 5A-5B are diagrams that show one example of substrate for mounting a semiconductor element thereon according to a second embodiment mode of the present invention, where
Figure 5B:
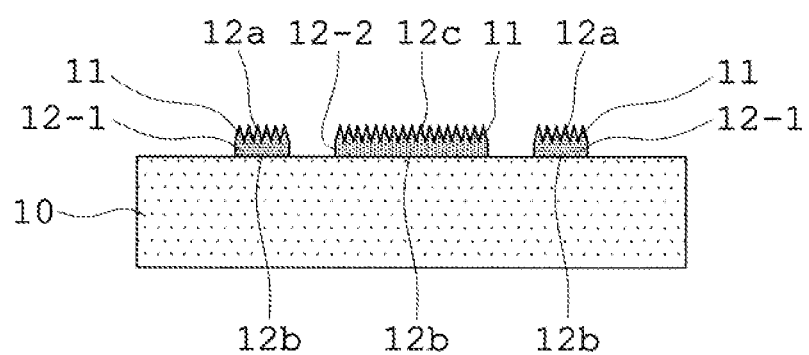
Figure 6:
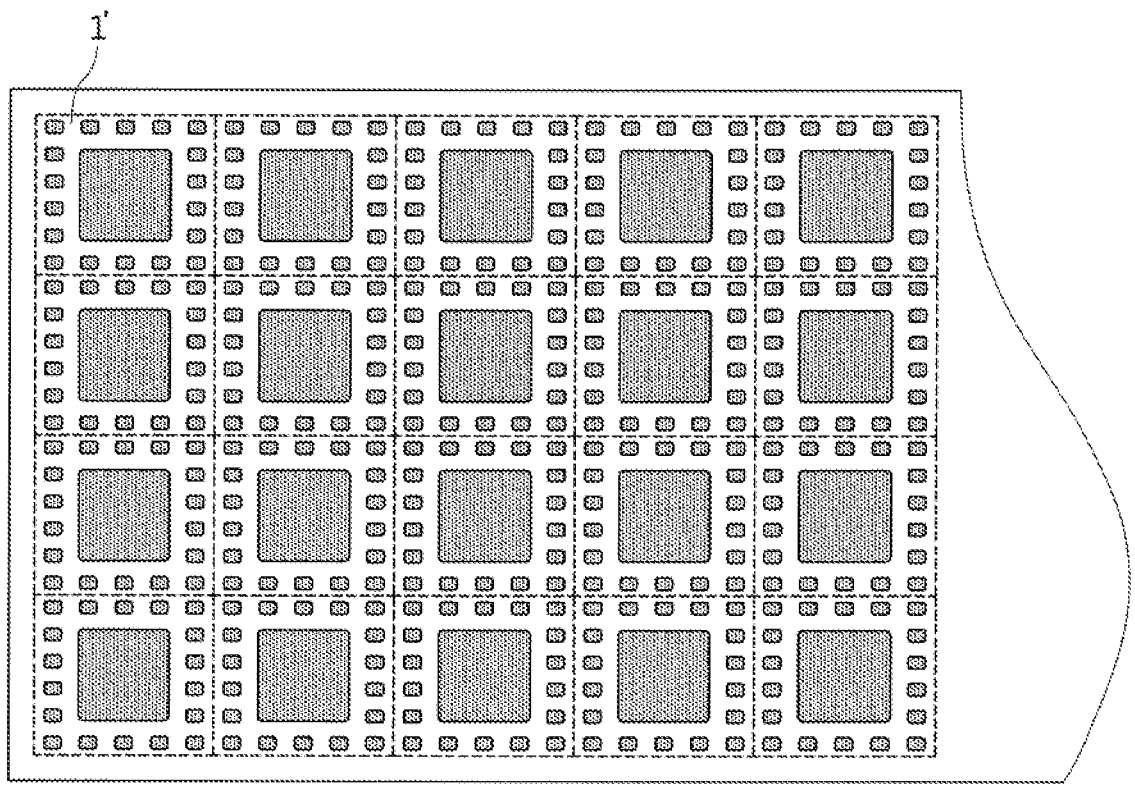
FIG. 6 is a plan view that shows one example of substrates for mounting semiconductor elements thereon arrayed in multiple rows according to the second embodiment mode of the present invention.
Figure 7A:
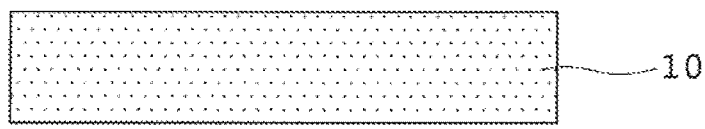
FIGS. 7A-7E are explanatory diagrams that show one example of manufacturing procedure for the substrate for mounting a semiconductor element thereon according to the second embodiment mode of the present invention.
Figure 7B:
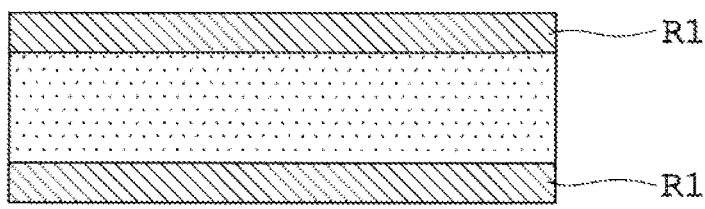
Figure 7C:
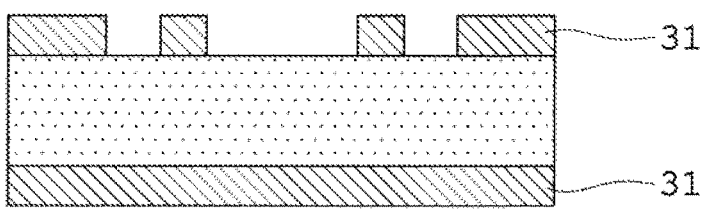
Figure 7D:
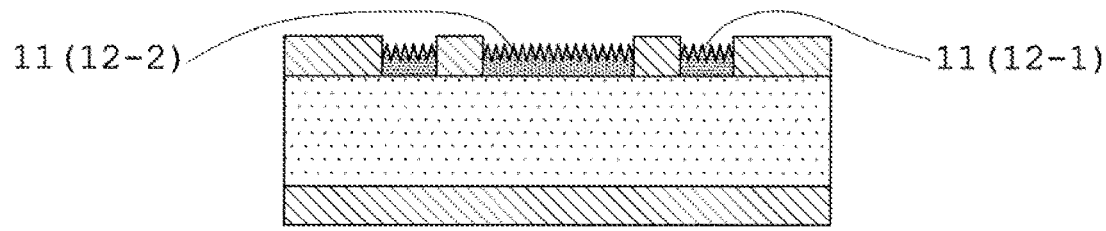
Figure 7E:
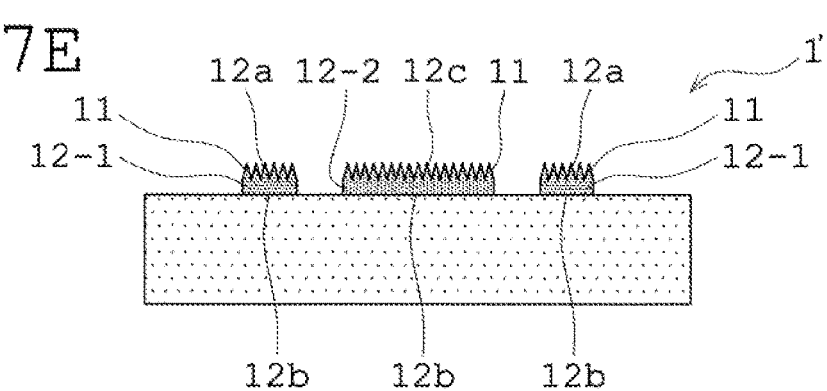

Second Embodiment Mode FIGS. 5A-5B are diagrams that show one example of substrate for mounting a semiconductor element thereon according to a second embodiment mode of the present invention, where FIG. 5A is a top view and FIG. 5B is an explanatory diagram schematically showing the B-B cross section in FIG. 5A. FIG. 6 is a plan view that shows one example of substrates for mounting semiconductor elements thereon arrayed in multiple rows according to the second embodiment mode of the present invention. FIGS. 7A-7E are explanatory diagrams that show one example of manufacturing procedure for the substrate for mounting a semiconductor element thereon according to the second embodiment mode of the present invention. FIGS. 8A-8F are explanatory diagrams that show one example of manufacturing procedure for a semiconductor package using the substrate for mounting a semiconductor element thereon according to the second embodiment mode of the present invention.

As shown in FIG. 5A, a substrate 1' for mounting a semiconductor element thereon of this embodiment mode is provided with a columnar terminal portion 12-2 with a large area arranged at the center position and a plurality of columnar terminal portions 12-1 with small areas arrayed along four sides around the columnar terminal portion 12-2. The columnar terminal portion 12-2 is configured, at the top face thereof, as a pad portion 12c on which a semiconductor element is to be mounted, and the columnar terminal portions 12-1 are configured, at the top faces thereof, as internal connection terminal portions 12a to be electrically connected with the semiconductor element via bonding wires.

The columnar terminal portions 12-1, 12-2 are composed only of plating layers of different metals and, as shown in FIG. 5B, are provided with a roughened silver plating layer 11 having acicular projections, as an outermost plating layer.

The remaining configurations are substantially the same as in the substrate 1 for mounting a semiconductor element thereon of the first embodiment mode.

The substrate 1' for mounting a semiconductor element thereon of this embodiment mode is configured so that, as shown in FIG. 6, the individual substrates 1' for mounting semiconductor elements thereon are arrayed in multiple rows.

Next, an example of manufacturing procedure for the substrate 1' for mounting a semiconductor element thereon of this embodiment mode will be described in reference to FIGS. 7A-7E.

The manufacturing procedure for the substrate 1' for mounting a semiconductor element thereon of this embodiment mode is substantially the same as the manufacturing procedure for the substrate 1 for mounting a semiconductor element thereon of the first embodiment mode shown in FIGS. 3A-3E, and the process of forming the roughened silver plating layer 11 having acicular projections as an outermost plating layer also is substantially the same as that in the substrate 1 for mounting a semiconductor element thereon of the first embodiment mode (See FIG. 7A through FIG. 7E).

Next, an example of manufacturing procedure for a semiconductor package using the substrate 1' for mounting a semiconductor element thereon of this embodiment mode will be described in reference to FIGS. 8A-8F.

Figure 8A:
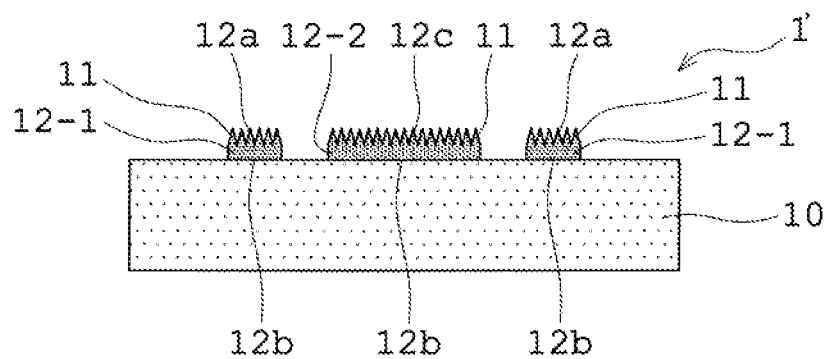
FIGS. 8A-8F are explanatory diagrams that show one example of manufacturing procedure for a semiconductor package using the substrate for mounting a semiconductor element thereon according to the second embodiment mode of the present invention.

First, the substrate' 1 for mounting a semiconductor element thereon manufactured in accordance with the manufacturing procedure shown in FIGS. 7A-7E is prepared (See FIG. 8A).

Figure 8B:
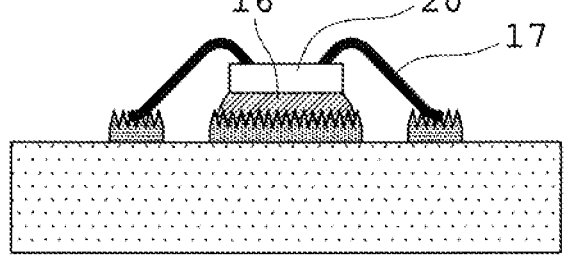

Then, a semiconductor element 20 is mounted and fixed on the pad portion 12c of the columnar terminal portion 12-2 on the upper surface side of the substrate 1' for mounting a semiconductor element thereon via die bond 16, and electrodes of the semiconductor element 20 and the internal connection terminal portions 12a of the columnar terminal portions 12-1 are electrically connected via bonding wires 17 (See FIG. 8B).

Figure 8C:
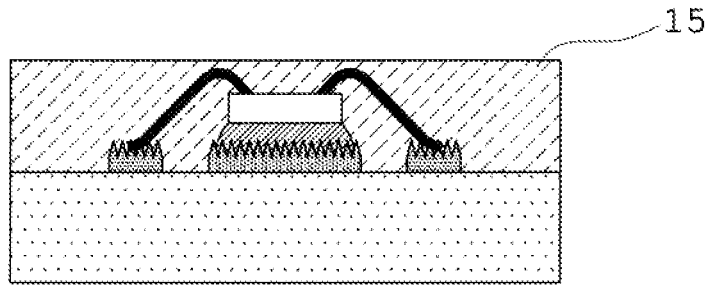

Then, a mold is used to seal, with sealing resin 15, a surrounding space region on the upper surface side of the substrate 1' for mounting a semiconductor element thereon (See FIG. 8C).

Figure 8D:
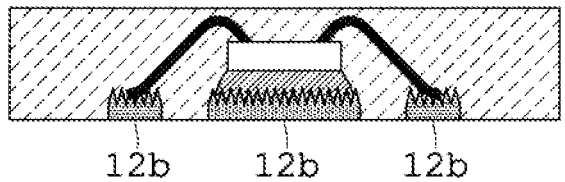
Figure 8E:
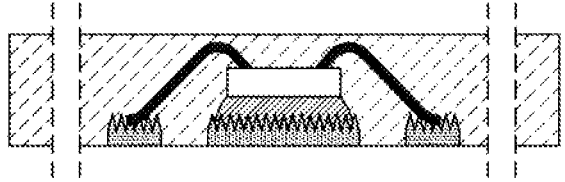

Then, the metal plate 10 serving as a base of the substrate 1' for mounting a semiconductor element thereon is removed by etching in the case of the metal plate 10 being made of a copper-based material or by peeling in the case of the metal plate 10 being made of a stainless steel-based material (See FIG. 8D).

Lastly, semiconductor packages arrayed in multiple rows are singulated by dicing, pressing or the like (See FIG. BE).

Figure 8F:
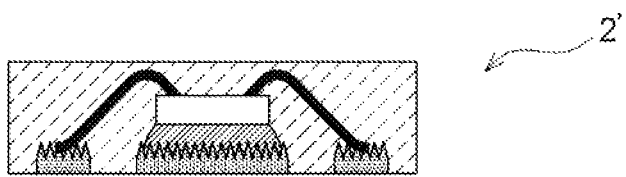

Thereby, a semiconductor package 2' using the substrate 1' for mounting a semiconductor element thereon of this embodiment mode is obtained (See FIG. 8F).

Embodied Example 1

A strip copper material (C194 copper alloy) with a thickness of 0.15 mm and a width of 180 mm was prepared as a base material 10 of a substrate for mounting a semiconductor element thereon (See FIG. 3A), and film resist with a thickness of 50 μm was laminated on both surfaces of the copper material, to form resist layers R1 (See FIG. 3B)

Lamination was conducted at a roll temperature of 105° C., a roll pressure of 0.5 MPa, and a feed rate of 2.5 m/min. The laminated film resist was negative resist that was photosensitive to exposure to ultraviolet light.

Then, the resist layer R1 on the upper surface side was exposed and developed by use of a ultraviolet mercury lamp as a light source upon use of a glass mask carrying a predetermined pattern corresponding to columnar terminal portions 12-1 as well as the entire region of the resist layer R1 on the lower surface side of the metal plate 10 was exposed and developed, to form plating resist masks 31 having openings at sites corresponding to the columnar terminal portions 12-1 on the upper surface side of the metal plate 10 and covering the entire region on the lower surface side of the metal plate 10 (See FIG. 3C).

Then, upon use of the plating resist masks 31, the sites corresponding to internal connection terminal portions 12a on the upper surface of the metal plate 10 were subjected to pretreatment with alkali and acid (removal of surface oxide film and activation treatment of the surface) and then were electroplated in the following manner.

First, a gold plating layer with a thickness of 0.05 μm was formed, and thereon, by use of a nickel plating bath composed of nickel sulfamate, nickel chloride and boric acid, plating was performed for 90 minutes at a current density of 2 A/dm², to form a smooth-crystal nickel plating layer with a thickness of 31.0 μm.

Then, by use of a silver plating bath with a silver concentration of 3.5 g/L, which was composed of a methanesulfonic acid-based silver plating solution, plating was performed for 15 seconds at a current density of 5 A/dm² and at a temperature of 60'C, to form a roughened silver plating layer 11 with a thickness of about 0.5 μm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), thereby completing the columnar terminal portions 12-1 (See FIG. 3D).

Then, the plating resist masks 31 were removed by an alkaline solution (See FIG. 3E), thereby to obtain a substrate 1 for mounting a semiconductor element thereon of Embodied Example 1.

Embodied Example 2

A strip stainless steel material (SUS430) with a thickness of 0.15 mm and a width of 180 mm was prepared as a base material 10 of a substrate for mounting a semiconductor element thereon (See FIG. 3A), and two sheets of film resist each with a thickness of 38 μm were laminated on the upper surface side of the stainless steel material and one sheet of the same film resist was laminated on the lower surface side, to form resist layers R1 (See FIG. 3B).

Lamination was conducted at a roll temperature of 105° C., a roll pressure of 0.5 MPa, and a feed rate of 2.5 m/min.

Then, as in Embodied Example 1, the resist layer R1 on the upper surface side was exposed and developed by use of a ultraviolet mercury lamp as a light source upon use of a glass mask carrying a predetermined pattern corresponding to columnar terminal portions 12-1 as well as the entire region of the resist layer R1 on the lower surface side of the metal plate 10 was exposed and developed, to form plating resist masks 31 having openings at sites corresponding to the columnar terminal portions 12-1 on the upper surface side of the metal plate 10 and covering the entire region on the lower surface side of the metal plate 10 (See FIG. 3C).

Then, upon use of the plating resist masks 31, the sites corresponding to internal connection terminal portions 12a on the upper surface of the metal plate 10 were subjected to pretreatment with alkali and acid (removal of surface oxide film and activation treatment of the surface) and then were electroplated in the following manner.

To be specific, first, a gold plating layer with a thickness of 0.05 μm was formed, and thereon, by use of a nickel plating bath composed of nickel sulfamate, nickel chloride and boric acid, plating was performed for 90 minutes at a current density of 2 A/dm², to form a smooth-crystal nickel plating layer with a thickness of 31.0 μm, and thereon a palladium plating layer of 0.06 μm was formed.

Then, by use of a silver plating bath with a silver concentration of 3.5 g/L, which was composed of a methanesulfonic acid-based silver plating solution, plating was performed for 15 seconds at a current density of 5 A/dm² and at a temperature of 60° C., to form a roughened silver plating layer 11 with a thickness of 0.5 μm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), thereby completing the columnar terminal portions 12-1 (See FIG. 3D).

Then, the plating resist masks 31 were removed by an alkaline solution (See FIG. 3E), thereby to obtain a substrate 1 for mounting a semiconductor element thereon of Embodied Example 2.

Embodied Example 3

In Embodied Example 3, up to formation of the plating resist masks 31 (See FIG. 3C) and pretreatment for electroplating, steps were carried out substantially in the same manner as in Embodied Example 1. Then, in electroplating, a gold plating layer with a thickness of 0.05 μm was formed, thereon a palladium plating layer with a thickness of 0.05

µm was formed, and thereon, by use of a nickel plating bath composed of nickel sulfamate, nickel chloride and boric acid, plating was performed for 90 minutes at a current density of 2 A/dm$^2$, to form a smooth-crystal nickel plating layer with a thickness of 30.0 µm.

Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60'C, to form a roughened silver plating layer 11 with a thickness of 0.5 µm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), thereby completing the columnar terminal portions 12-1 (See FIG. 3D).

Then, the plating resist masks 31 were removed by an alkaline solution (See FIG. 3E), thereby to obtain a substrate 1 for mounting a semiconductor element thereon of Embodied Example 3.

Embodied Example 4

In Embodied Example 4, up to formation of the plating resist masks 31 (See FIG. 3C) and pretreatment for electroplating, steps were carried out substantially in the same manner as in Embodied Example 1. Then, in electroplating, a gold plating layer with a thickness of 0.06 µm was formed, thereon a palladium plating layer with a thickness of 0.04 µm was formed, and thereon, by use of a nickel plating bath composed of nickel sulfamate, nickel chloride and boric acid, plating was performed for 90 minutes at a current density of 2 A/dm$^2$, to form a smooth-crystal nickel plating layer with a thickness of 32.0 µm, on which a palladium plating layer with a thickness of 0.05 µm was formed.

Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60° C., to form a roughened silver plating layer 11 with a thickness of 0.5 µm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), thereby completing the columnar terminal portions 12-1 (See FIG. 3D).

Then, the plating resist masks 31 were removed by use an alkaline solution (See FIG. 3E), thereby to obtain a substrate 1 for mounting a semiconductor element thereon of Embodied Example 4.

Embodied Example 5

In Embodied Example 5, up to formation of the plating resist masks 31 (See FIG. 3C) and pretreatment for electroplating, steps were carried out substantially in the same manner as in Embodied Example 1. Then, in electroplating, a gold plating layer with a thickness of 0.05 µm was formed, and thereon, by use of a nickel plating bath composed of nickel sulfamate, nickel chloride and boric acid, plating was performed for 90 minutes at a current density of 2 A/dm$^2$, to form a smooth-crystal nickel plating layer with a thickness of 30.0 µm, on which a palladium plating layer with a thickness of 0.05 µm was formed.

Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60° C., to form a roughened silver plating layer 11 with a thickness of 0.5 µm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), thereby completing the columnar terminal portions 12-1 (See FIG. 3D).

Then, the plating resist masks 31 were removed by an alkaline solution (See FIG. 3E), thereby to obtain a substrate 1 for mounting a semiconductor element thereon of Embodied Example 5.

Embodied Example 6

In Embodied Example 6, up to formation of the plating resist masks 31 (See FIG. 3C) and pretreatment for electroplating, steps were carried out substantially in the same manner as in Embodied Example 1. Then, in electroplating, a gold plating layer with a thickness of 0.06 µm was formed, and thereon, by use of a nickel plating bath composed of nickel sulfamate, nickel chloride and boric acid, plating was performed for 90 minutes at a current density of 2 A/dm$^2$, to form a smooth-crystal nickel plating layer with a thickness of 32.0 µm, on which a palladium plating layer with a thickness of 0.04 µm was formed, and thereon a gold plating layer with a thickness of 0.006 µm was formed.

Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60° C., to form a roughened silver plating layer 11 with a thickness of 0.5 µm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), thereby completing the columnar terminal portions 12-1 (See FIG. 3D).

Then, the plating resist masks 31 were removed by an alkaline solution (See FIG. 3E), thereby to obtain a substrate 1 for mounting a semiconductor element thereon of Embodied Example 6.

Embodied Example 7

In Embodied Example 7, up to formation of the plating resist masks 31 (See FIG. 3C) and pretreatment for electroplating, steps were carried out substantially in the same manner as in Embodied Example 1. Then, in electroplating, a gold plating layer with a thickness of 0.06 µm was formed, thereon a palladium plating layer with a thickness of 0.05 mm was formed, and thereon, by use of a nickel plating bath composed of nickel sulfamate, nickel chloride and boric acid, plating was performed for 90 minutes at a current density of 2 A/dm$^2$, to form a smooth-crystal nickel plating layer with a thickness of 31.0 µm, on which a palladium plating layer with a thickness of 0.04 µm was formed, and thereon a gold plating layer with a thickness of 0.006 µm was formed.

Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60° C., to form a roughened silver plating layer 11 with a thickness of 0.5 µm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), thereby completing the columnar terminal portions 12-1 (See FIG. 3D).

Then, the plating resist masks 31 were removed by an alkaline solution (See FIG. 3E), thereby to obtain a substrate 1 for mounting a semiconductor element thereon of Embodied Example 7.

Comparative Example 1

In Comparative Example 1, up to formation of the gold plating layer in electroplating treatment, steps were carried out substantially in the same manner as in Embodied Example 1. Then, on the gold plating layer, by use of a nickel plating bath composed of nickel sulfamate, nickel chloride and boric acid, plating was performed for 90 minutes at a current density of 2 A/dm$^2$, to form a nickel plating layer with a thickness of 30.0 µm. Then, by use of a silver plating bath with a silver concentration of 65 g/L, which was composed of a cyan-based silver plating solution, plating was performed for 1 minute and 30 seconds at a current density of 3 A/dm$^2$, to form a silver plating layer with a thickness of 1.5p m and a smooth surface, thereby completing columnar terminal portions. Then, the plating resist masks 31 were removed by an alkaline solution (See FIG. 3E), thereby to obtain a substrate for mounting a semiconductor element thereon of Comparative Example 1.

Comparative Example 2

A substrate for mounting a semiconductor element thereon of Comparative Example 2 is an example of substrate for mounting a semiconductor element thereon in which a silver plating layer having a roughened surface with unevenness expressed by a surface area ratio (i.e. the ratio of the surface area of the roughened silver plating layer to the surface area of a corresponding smooth surface) of less than 1.30 composes, as an outermost plating layer, columnar terminal portions.

In Comparative Example 2, up to formation of the nickel plating layer in electroplating treatment, steps were carried out substantially in the same manner as in Embodied Example 1. Then, by use of a silver plating bath with a silver concentration of 65 g/L, which was composed of a cyan-based silver plating solution, plating was performed for 5 minutes at a current density of 3 A/dm$^2$, to form a silver plating layer with a thickness of 4.0 µm and a smooth surface. Then, the surface of the silver plating layer was subjected to microetching treatment for 2 minutes by use of a stripping solution for silver plating, to form a roughened outer face with unevenness on the surface of the silver plating layer, thereby completing columnar terminal portions. The silver plating layer given the roughened outer face with unevenness had a thickness of 1.7 µm. Then, the plating resist masks were removed by use of alkaline solution (See FIG. 3E), thereby to obtain a substrate for mounting a semiconductor element thereon of Comparative Example 2.

Comparative Example 3

A substrate for mounting a semiconductor element thereon of Comparative Example 3 is an example of substrate for mounting a semiconductor element thereon in which an undercoat plating layer having a roughened outer surface is formed and thereon a silver plating layer is formed, to compose columnar terminal portions.

In Comparative Example 3, up to formation of the gold plating layer in electroplating treatment, steps were carried out substantially in the same manner as in Embodied Example 1.

In the subsequent electroplating treatment, first, by use of a nickel plating bath composed of nickel sulfamate, nickel chloride and boric acid, plating was performed for 97 minutes and 30 seconds at a current density of 2 A/dm$^2$, to form a nickel plating layer with a thickness of about 34.5 µm and a smooth surface. Then, the outer surface of the nickel plating layer was subjected to microetching treatment for 2 minutes by use of a stripping solution for nickel plating, to form a roughened face with unevenness on the outer surface of the nickel plating layer. The nickel plating layer given the roughened face with unevenness had a thickness of 32.0 µm. Then, by use of a silver plating bath with a silver concentration of 65 g/L, which was composed of a cyan-based silver plating solution, plating was performed for 1 minute and 30 seconds at a current density of 3 A/dm$^2$, to form, as following the shape of the roughened surface of the nickel plating layer, a silver plating layer with a thickness of 1.6 µm and a roughened surface with unevenness having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value), thereby completing columnar terminal portions. Then, the plating resist masks were removed by an alkaline solution, thereby to obtain a substrate for mounting a semiconductor element thereon of Comparative Example 3.

The plating composition requirements (type and thickness of plating layers, surface area ratio (i.e. ratio of surface area of (roughened or smooth) silver plating layer to surface area of corresponding smooth surface), proportions of crystal directions in the silver plating layer, and crystal grain diameter (average value)) for each of the substrates for mounting semiconductor elements thereon of Embodied Examples 1 to 7 and Comparative Examples 1 to 3 are shown in Table 1.

It is noted that the field of view observed at 10,000× through a scanning electron microscope (SEM: Scanning Electron Microscope) was analyzed by an electron backscatter diffraction analyzer (EBSD: Electron Backscatter Diffraction) so that the proportions of crystal directions were calculated upon allowable angles for the respective directions being set to 15°. Further, a diameter of a crystal grain was defined as a diameter of a circle with an area equivalent to that of the crystal grain, which was defined by a grain boundary where the direction difference was 15° or more.

TABLE 1

| Example | Columnar Terminal Portion Undercoat Layer | | | | | Outermost Ag Plating Layer | | | | | | |
|---|---|---|---|---|---|---|---|---|---|---|---|---|
| | Surface Morphology | Thickness (μm) | | | | Surface Morphology | Thickness (μm) | Surface Area Ratio | Proportion of Crystal Direction (%) | | | Crystal Grain Diameter (μm) |
| | | Au | Pd | Ni | Pd | Au | | | | <001> | <111> | <101> | |
| Embodied Example 1 | Smooth | 0.05 | — | 31 | — | — | Acicular Projections | 0.5 | 3.0 | 8.5 | 15.8 | 22.8 | 0.1955 |
| Embodied Example 2 | Smooth | 0.05 | — | 31 | 0.06 | — | Acicular Projections | 0.5 | 3.1 | 8.8 | 16.0 | 23.1 | 0.1907 |
| Embodied Example 3 | Smooth | 0.05 | 0.05 | 30 | — | — | Acicular Projections | 0.5 | 3.1 | 9.1 | 15.7 | 23.0 | 0.2040 |
| Enibodied Example 4 | Smooth | 0.06 | 0.04 | 32 | 0.05 | — | Acicular Projections | 0.5 | 2.9 | 8.8 | 16.2 | 22.7 | 0.1963 |
| Embodied Example 5 | Smooth | 0.05 | — | 30 | 0.05 | — | Acicular Projections | 0.5 | 3.0 | 9.0 | 16.3 | 22.9 | 0.1904 |
| Embodied Example 6 | Smooth | 0.06 | — | 32 | 0.04 | 0.006 | Acicular Projections | 0.5 | 3.1 | 8.6 | 16.3 | 23.0 | 0.1883 |
| Embodied Example 7 | Smooth | 0.06 | 0.05 | 31 | 0.04 | 0.006 | Acicular Projections | 0.5 | 3.0 | 8.9 | 15.8 | 23.5 | 0.1965 |
| Comparatve Example 1 | Smooth | 0.05 | — | 30 | — | — | Smooth | 1.5 | 1.0 | 23.5 | 14.0 | 6.7 | 0.3308 |
| Comparalive Example 2 | Smooth | 0.05 | — | 31 | — | — | Unevenness by Etching | 1.7 | 1.3 | 22.8 | 13.9 | 7.1 | 0.3121 |
| Comparative Example 3 | Unevenness by Etching | 0.05 | — | 32 | — | — | Unevenness following Ni Layer | 1.6 | 1.3 | 22.5 | 13.8 | 7.0 | 0.3288 |

Evaluation of Resin Adhesiveness

A cylindrical resin mold of 02 mm for evaluation purpose was formed on the roughened silver plating layer (the smooth silver plating layer in the case of Comparative Example 1) of each of the completed substrates for mounting semiconductor elements thereon of Embodied Examples 1 to 7 and Comparative Examples 1 to 3. The shear strength of this resin was measured with a bond tester Dage Series 4000 (manufactured by Dage Corporation), to evaluate resin adhesiveness.

The evaluation results of resin adhesiveness of Embodied Examples 1 to 7 and Comparative Examples 1 to 3 are shown in Table 2.

TABLE 2

| Examples | Adhesion Strength (MPa) | Process Time (Set to 100 for Comparative Example 1) | Amount of Ag Use (Set to 100 for Comparative Example 1) |
|---|---|---|---|
| Embodied Example 1 | 15 | 100 | 30 |
| Embodied Example 2 | 15 | 100 | 30 |
| Embodied Example 3 | 15 | 100 | 30 |
| Embodied Example 4 | 15 | 100 | 30 |
| Embodied Example 5 | 15 | 100 | 30 |
| Embodied Example 6 | 15 | 100 | 30 |
| Embodied Example 7 | 15 | 100 | 30 |
| Comparative Example 1 | 10 | 100 | 100 |
| Comparative Example 2 | 12 | 100 | 270 |
| Comparative Example 3 | 12 | 108 | 100 |

The substrate for mounting a semiconductor element thereon of Comparative Example 1, with a shear strength of 10 MPa, was observed hardly to have a sufficient resin adhesiveness for practical use.

In contrast, as shown in Table 2, each of the substrates for mounting semiconductor elements thereon of Embodied Examples 1 to 7 had a shear strength 1.5 times the shear strength of the substrate for mounting a semiconductor element thereon of Comparative Example 1, and was observed to have a remarkably improved resin adhesiveness.

On the other hand, although each of the substrates for mounting semiconductor elements thereon of Comparative Examples 2 and 3 had an improved resin adhesiveness with a shear strength higher than the substrate for mounting a semiconductor element thereon of Comparative Example 1, it was only 1.2 times as high as the substrate for mounting a semiconductor element thereon of Comparative Example 1 and failed to achieve a remarkable effect of improved resin adhesiveness as in the substrates for mounting semiconductor elements thereon of Embodied Examples 1 to 7.

Evaluation of Productivity

Comparison was made regarding the processing time and the amount of silver plating required to form the surface morphology of the outermost plating layer in each of the substrates for mounting semiconductor elements thereon of Embodied Examples 1 to 7 and Comparative Examples 2 and 3 into the form of a plating layer having a roughened surface, to evaluate productivity. In evaluation of productivity, upon the processing time and the amount of use of silver plating for the substrate for mounting a semiconductor element thereon of Comparative Example 1, in which a smooth silver plating layer was formed as the outermost layer, being set to 100, respectively, relative numerical values were used as evaluation values. In addition, since a substrate for mounting a semiconductor element thereon should be subjected to plating process while being line-conveyed, the evaluation value of the processing time was calculated on the basis of the time required for forming a metal plating layer that required the longest plating time in the plating process for the substrate for mounting a semiconductor element thereon of each of Embodied Examples and Comparative Examples (Embodied Examples 1 to 7, Comparative Examples 2 and 3: smooth nickel plating).

The evaluation results of productivity (the processing time and the amount of silver plating required to form the surface morphology of the outermost plating layer into the form having a roughened surface) of Embodied Examples 1 to 7 and Comparative Examples 2 and 3 are shown in Table 2.

The substrate for mounting a semiconductor element thereon of Comparative Example 2 is an example in which, after formation of a silver plating layer with a smooth surface and a thickness of about 4.0 m, a roughened, uneven surface was formed at the outer surface of the silver plating layer by microetching treatment with use of a silver plating stripping solution. The thickness of the silver plating layer with a roughened, uneven surface was 1.5 µm, which is about half the thickness of the silver plating layer with a smooth surface. As shown in Table 2, with the processing time being 100 and the amount of silver use being 270, the productivity was observed to be poor because of a very high cost of silver, the prime cost of which is expensive.

The substrate for mounting a semiconductor element thereon of Comparative Example 3 is an example in which, after formation of a nickel plating layer with a smooth surface and a thickness of about 34.5 µm, by microetching treatment with use of a nickel plating stripping solution, a roughened, uneven surface was formed at the outer surface of the silver plating layer. The thickness of the nickel plating layer with a roughened, uneven surface was 32.0 µm. As shown in Table 2, with the processing time being 108 and the amount of silver use being 100, it was observed that the productivity was poor because of the long processing time.

On the other hand, as shown in Table 2, for every one of the substrates for mounting semiconductor elements thereon of Embodied Examples 1 to 7, the processing time was 100 and the amount of silver use was 30. As compared with the substrate for mounting a semiconductor element thereon of Comparative Example 2, while the processing time was at the same level, the manufacturing cost was observed to be remarkably reduced with the amount of silver use being reduced by 89%. Also, as compared with the substrate for mounting a semiconductor element thereon of Comparative Example 3, the productivity was observed to be remarkably improved with the processing time being reduced by 8% and the amount of silver use being reduced by 70%.

Although the preferred embodiment modes and the embodied examples of the present invention have been described in detail above, the present invention is not limited to the embodiment modes and the embodied examples described above. Various modifications and substitutions may be made to the embodiment modes and the embodied examples described above without deviating from the scope of the present invention.

The description has been made that, regarding the substrate for mounting a semiconductor element thereon of the present invention, the base material of the substrate for mounting a semiconductor element thereon is a copper-based material such as a copper alloy or a stainless steel-based alloy. However, a nickel-based alloy also may be employed as the base material of the substrate for mounting a semiconductor element thereon.

Further, in the substrate for mounting a semiconductor element thereon of the present invention, as long as its thickness does not impair the surface area ratio and the crystal structure of the roughened surface having acicular projections, a silver plating layer or plating layers combining nickel, palladium, and gold may be laminated, as a plating layer for cover, on the roughened silver plating layer having acicular projections provided as the outermost layer.

What is claimed is:

1. A substrate for mounting a semiconductor element thereon, comprising:
    a metal plate; and
    columnar terminal portions consisting of plating layers and formed on one-side surface of the metal plate,
    wherein the columnar terminal portions include, as an outermost plating layer, a roughened silver plating layer having acicular projections, and
    wherein the roughened silver plating layer has a crystal structure in which the crystal direction <101> occupies a largest proportion among the crystal directions <001>, <111> and <101>.

2. The substrate for mounting a semiconductor element thereon according to claim 1,
    wherein an average diameter of crystal grains in the roughened silver plating layer is smaller than 0.28 µm.

3. The substrate for mounting a semiconductor element thereon according to claim 1,
    wherein, in the columnar terminal portions, a plating layer that is in contact with the metal plate is a gold plating layer.

4. The substrate for mounting a semiconductor element thereon according to claim 1,
    wherein the columnar terminal portions are composed of plating layers of metals laminated in order of appearance in any of the following (1) to (6) from a metal-plate side:
    (1) gold/nickel/silver;
    (2) gold/palladium/nickel/silver;
    (3) gold/palladium/nickel/palladium/silver;
    (4) gold/nickel/palladium/silver;
    (5) gold/nickel/palladium/gold/silver;
    (6) gold/palladium/nickel/palladium/gold/silver.

* * * * *